United States Patent
Berman et al.

(10) Patent No.: US 11,031,956 B2
(45) Date of Patent: Jun. 8, 2021

(54) GENERALIZED CONCATENATED ERROR CORRECTION CODING SCHEME WITH LOCALITY

(71) Applicant: SAMSUNG ELECTRONICS CO., LTD., Suwon-si (KR)

(72) Inventors: Amit Berman, Ramat Gan (IL); Ariel Doubchak, Ramat Gan (IL); Avner Dor, Kfar Saba (IL)

(73) Assignee: SAMSUNG ELECTRONICS CO., LTD., Yonging-si (KR)

( * ) Notice: Subject to any disclaimer, the term of this patent is extended or adjusted under 35 U.S.C. 154(b) by 45 days.

(21) Appl. No.: 16/452,240

(22) Filed: Jun. 25, 2019

(65) Prior Publication Data
US 2020/0412386 A1  Dec. 31, 2020

(51) Int. Cl.
*H03M 13/29* (2006.01)
*H03M 13/15* (2006.01)
*G06F 3/06* (2006.01)

(52) U.S. Cl.
CPC ...... *H03M 13/2915* (2013.01); *G06F 3/0614* (2013.01); *G06F 3/0653* (2013.01); *G06F 3/0679* (2013.01); *H03M 13/1515* (2013.01)

(58) Field of Classification Search
CPC .......... H03M 13/2915; H03M 13/1515; G06F 3/0614; G06F 3/0653; G06F 3/0679
See application file for complete search history.

(56) References Cited

U.S. PATENT DOCUMENTS

| | | | |
|---|---|---|---|
| 2012/0051544 A1* | 3/2012 | Liu | H04L 9/14 380/270 |
| 2013/0091400 A1* | 4/2013 | Xia | G11B 20/1833 714/755 |
| 2017/0102993 A1* | 4/2017 | Hu | G11C 13/0059 |

* cited by examiner

*Primary Examiner* — Thien Nguyen
(74) *Attorney, Agent, or Firm* — F. Chau & Associates, LLC

(57) ABSTRACT

A method for storing data within a memory device includes receiving data to be stored. The received data is encoded. The encoded data is stored within the memory device. Encoding the received data includes encoding the data into two or more sub-codewords. Each of the two or more sub-codewords includes a plurality of outer codewords. Two or more of the plurality of outer codewords are grouped to form a larger codeword that is larger than each of the plurality of outer codewords and the larger codeword is constructed to correct errors and/or erasures that are not correctable by the plurality of outer codewords, individually.

20 Claims, 5 Drawing Sheets

GENERALIZED CONCATENATED ERROR CORRECTION CODING SCHEME WITH LOCALITY

TECHNICAL FIELD

The present disclosure relates to error correction coding and, more specifically, to a generalized concatenated error correction coding scheme having locality.

DISCUSSION OF THE RELATED ART

Error correction coding schemes have been developed as a way to ensure accurate digital communication across a noisy channel. Thus, as the noisy channel may cause transmitted data to be missing or changed during transmission, error correction coding may be used to ensure accurate decoding, even where some data is missing or changed.

More recently, error correction coding has been used to store data within a memory device. As there is also some probability that data stored within memory cells may be missing or changed prior to being read, error correction coding may be used to ensure accurate storage of data from within a memory device.

One common scheme for error correction coding is Reed-Solomon (RC) codes. According to this approach, a block of data is represented as a set of elements known as symbols. Some number of check symbols are added to the data so that incorrect or missing symbols can be corrected upon decoding the data.

Another common scheme for error correction coding is low-density parity-check (LDPC) codes. According to this approach, parity check symbols are added to the data. These parity check symbols may be constructed using a sparse bipartite graph.

In error correction code schemes such as the above, the data and check symbols are grouped together into strings known as codewords. In decoding, an entire codeword must generally be received before any of the data therein can be decoded. This creates two tradeoffs. According to the first tradeoff, using a greater number of check symbols may allow for accurate decoding even in the event of more errors, but using a smaller number of check symbols may allow for less overhead and therefore allowing more encoded data to be stored within a memory device of a fixed size and may also allow for faster decoding. According to the second tradeoff, while longer codewords may require less overhead, thereby allowing more encoded data to be stored within a memory device, more data must be received before data can be decoded, leading to increased latency in reading data from memory devices. Conversely, using shorter codewords may reduce latency but may also increase overhead thereby allowing less data to be stored into a memory device, and/or requiring more computational resources to perform the decoding.

SUMMARY

A method for storing data within a memory device includes receiving data to be stored. The received data is encoded. The encoded data is stored within the memory device. Encoding the received data includes encoding the data into two or more sub-codewords. Each of the two or more sub-codewords includes a plurality of outer codewords. Two or more of the plurality of outer codewords are grouped to form a larger codeword that is larger than each of the plurality of outer codewords and the larger codeword is constructed to correct errors and/or erasures that are not correctable by the plurality of outer codewords, individually.

A method for retrieving data within a memory device includes reading stored data from a memory device. The read data is decoded. Decoding the read data includes individually decoding sub-codewords of the read data. When a sub-codeword of the read data cannot be decoded, decoding the read data includes decoding a plurality of outer codewords, each of which includes two or more sub-codewords including the sub-codeword that could not be individually encoded.

A method for storing data within a memory device includes receiving data to be stored. The received data is encoded. The encoded data is stored within the memory device. Encoding the received data includes encoding the data into a plurality of sub-codewords within a first layer of encoding, grouping the plurality of sub-codewords into a plurality of outer codewords within a second layer of encoding, and grouping the plurality of outer codewords into at least one larger codeword that is larger than each of the plurality of outer codewords.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE DRAWINGS

Figure 1:
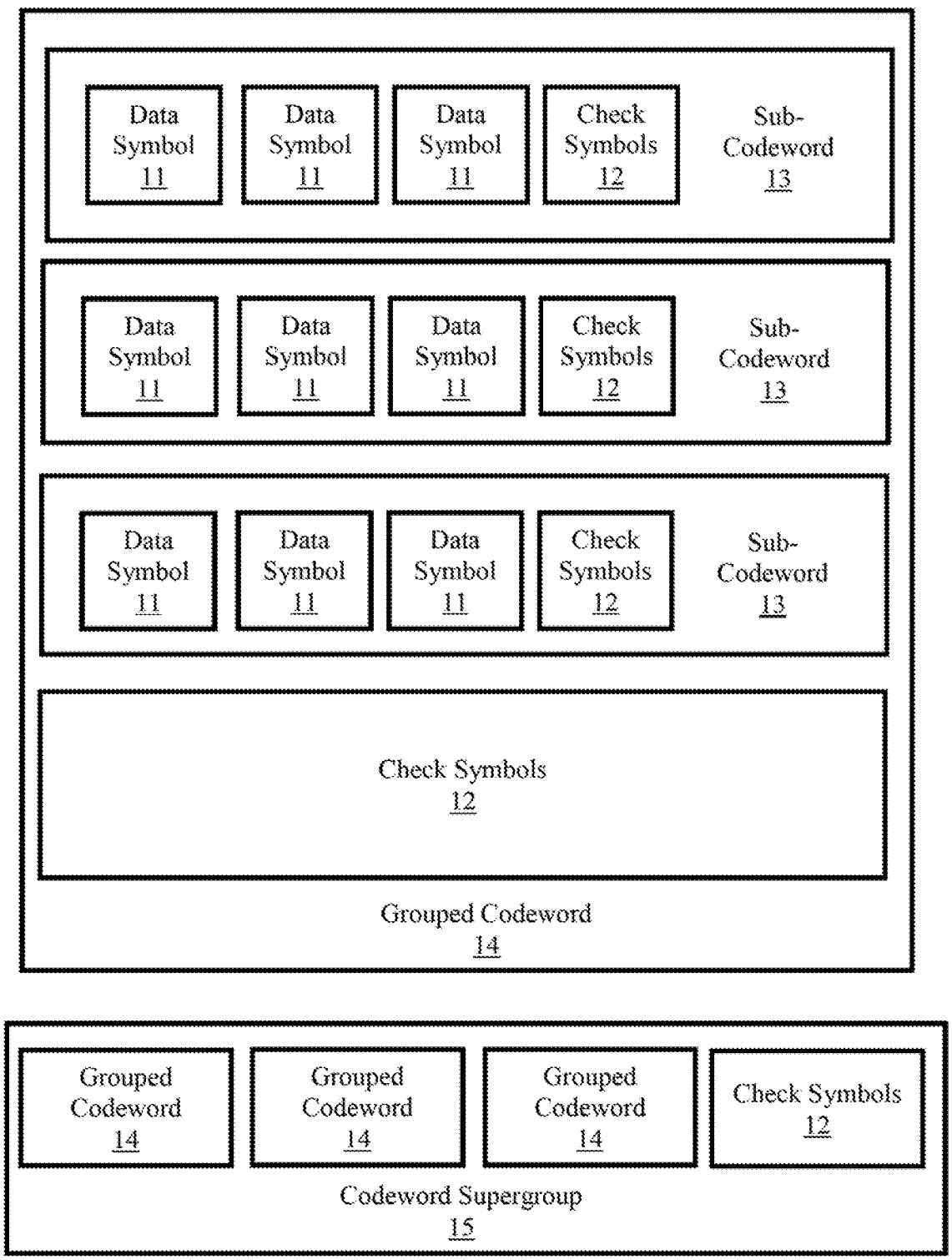
FIG. 1 is a schematic diagram illustrating data groupings in accordance with exemplary embodiments of the present invention.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Exemplary embodiments of the present invention provide approaches for encoding data for transmission across a noisy channel or for storage and retrieval to and from a memory device that, at the same time, allows for the advantages of encoding shorter codewords using fewer check symbols such as less latency, but also for the advantages of encoding longer codewords using more check symbols such as higher data accuracy and the ability to accommodate more errors. According to these approaches, data may be encoded into shorter codewords or sub-codewords with relatively fewer check codewords and groups of these shorter codewords or sub-codewords may be combined into a larger codeword or codeword group that include additional check symbols.

Decoding may then be performed on the shorter codewords or sub-codewords having fewer check symbols to the greatest extent possible and where decoding is not successful, for example, due to excessive errors for which there are insufficient check symbols to correct for, decoding may be performed again on the larger codeword or codeword group upon its complete receipt.

As used herein, the groupings of symbols in smaller codewords may be referred to herein as sub-codewords while the groupings of symbols in larger codewords may be refereed to herein as grouped-codewords. Thus data may be encoded into sub-codewords that may be decoded locally by the receipt of the entire sub-codewords and then a group of sub-codewords may be combined as grouped-codewords, the data of which may be decoded upon the receipt of the entire grouped-codewords, should it not be possible to decode the data based only on the sub-codewords, as may be the case where there are too many errors in the sub-codeword for accurate decoding. Thus, most often, data may be decoded as each sub-codeword is received in its entirety, thereby reducing latency. But where data of a particular sub-codeword cannot be decoded, the data may be decoded upon the receipt of the entire grouped-codeword, thereby providing an added level of data accuracy.

Moreover, exemplary embodiments of the present invention may further group sets of grouped-codewords into codeword super-groups. Thus, if data cannot be accurately decoded from either the sub-codeword or the grouped-codeword, that data may be decoded upon the receipt of the codeword super-group. At each level, more check symbols may be present so that the chances of decoding the data accurately increase at each level. It is to be further understood that the codeword super-groups may themselves be grouped into a next level grouping with additional check symbols, if desired, so that in the event that the data of the codeword super-group cannot be accurately decoding, the data may be decoded from the next level of grouping. In theory, any number of next level groupings may be used. For example, there may be 2, 3, 4, 5, 6, or more levels of groupings used. However, for the purpose of providing a simplified explanation, exemplary embodiments of the present invention will be described herein in terms of data being encoded as sub-codewords; sub-codewords being encoded as grouped-codewords, and grouped-codewords being encoded as codeword super-groups, with one or more check symbols being added at each grouping. This concept is shown in FIG. 1 which is a schematic diagram illustrating data groupings in accordance with exemplary embodiments of the present invention.

As may be seen by FIG. 1, the data may be encoded as data symbols 11 and there may be multiple data symbols 11 together with some number of check symbols 12 within a sub-codeword 13. There may be some number of sub-codewords 13 together with some number of check symbols 12 within a grouped codeword 14. Thus, each sub-codeword 13 is a symbol within the grouped codeword 14.

There may also be some number of grouped codewords 14 together with some number of check symbols 12 within a codeword supergroup 15. Thus, each grouped codeword 14 is a symbol within the codeword supergroup 15. There may be any number of codeword supergroups 15 so-configured.

Any suitable coding scheme may be used to encode the data into data symbols. For example, Reed-Solomon (RS) may be used or Bose-Chaudhuri-Hocquenghem (BCH) may be used. Thus, as BCH encoding may be used to encode the data into sub-codewords, BCH may also be used again to encode the sub-codewords into grouped codewords and to encode the grouped codewords into codeword supergroups.

According to another exemplary embodiment of the present invention, data may be encoded, with the ability to decode either locally or generally, as described above, by encoding data in accordance with Reed-Solomon (RS) coding, or some other similar encoding technique, and then grouping multiple RS codes of data together with one or more additional RS codes for redundancy, and then constructing a single parity check matrix for the set of data RS codes and redundant RS codes. This approach may be seen from FIG. 2 which is a schematic diagram illustrating an approach for data groupings in accordance with exemplary embodiments of the present invention.

Figure 2:
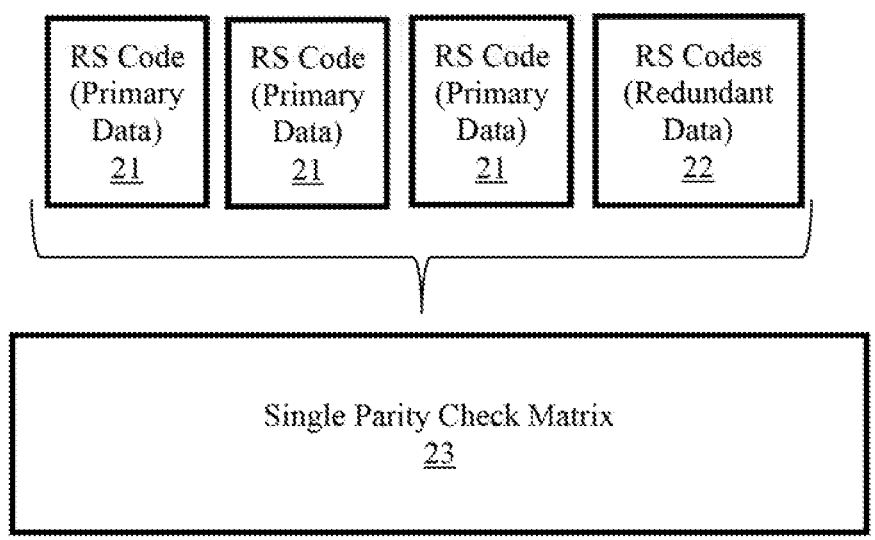
FIG. 2 is a schematic diagram illustrating an approach for data groupings in accordance with exemplary embodiments of the present invention.

As can be seen from FIG. 2, the data may be encoded as a set of primary data RS codes 21 and one or more redundant RS codes 22 may be grouped together with these primary data RS codes 21 so that a single parity check matrix may be constructed 23 therefrom. In this way, the data may be decoded at the RS code level, which is a local level, and if data cannot be accurately decoded therefrom, upon the receipt of the entire set of RS codes (primary data and redundant data) along with the parity check matrix, the data that might not have been decodable at the local level may be decoded using the redundant data RS codes and the parity check matrix.

Figure 3:
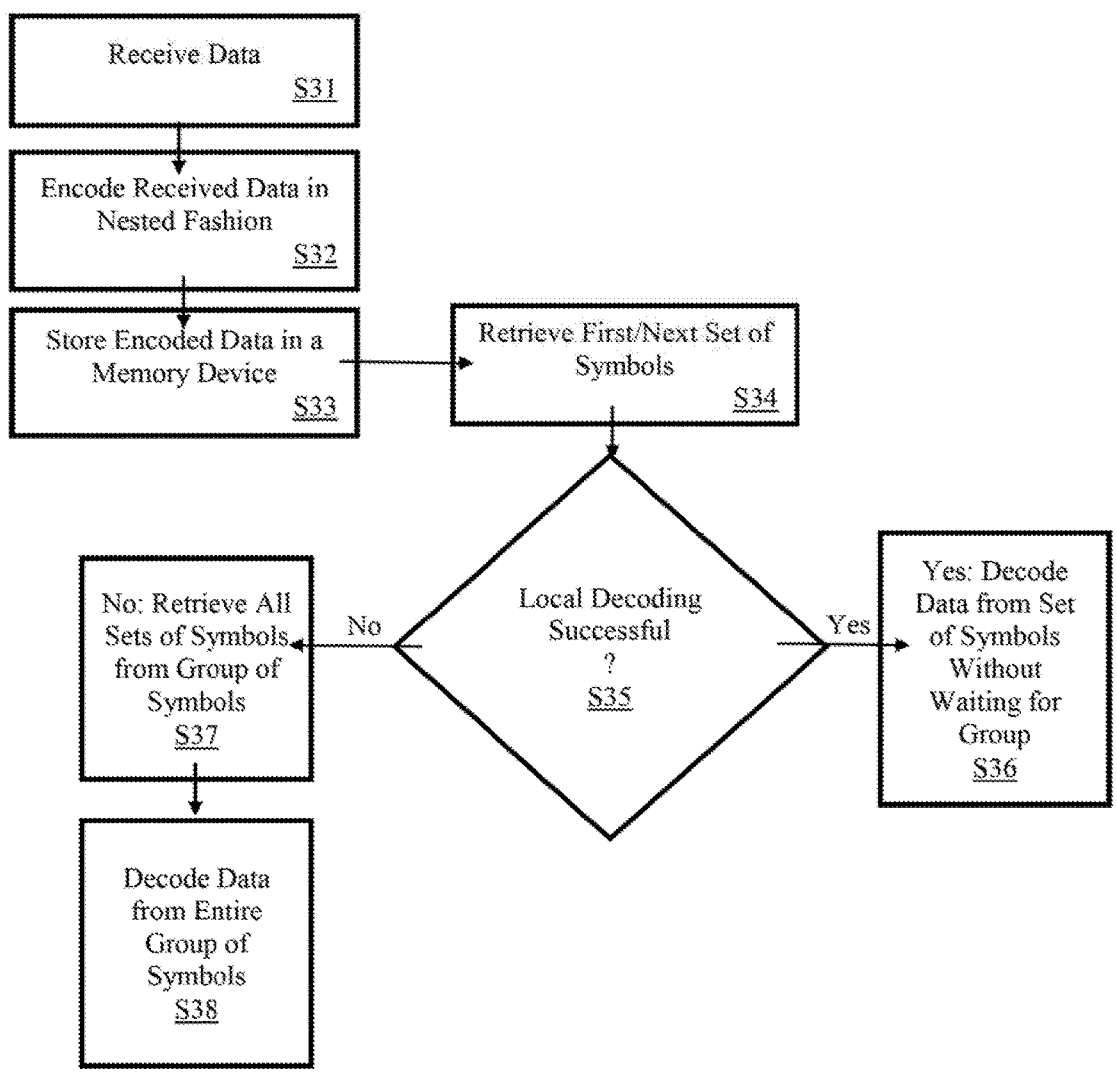
FIG. 3 is a flow chart illustrating an approach for encoding and decoding of data in accordance with exemplary embodiments of the present invention.

FIG. 3 is a flow chart illustrating an approach for encoding and decoding of data in accordance with exemplary embodiments of the present invention. Data may first be received (Step S31). The received data may then be encoded in accordance with the nested fashions described above (Step S32). The encoded data may then be stored in a memory device (Step S33). At a later point, retrieval of the data stored in the memory device may begin. As part of this retrieval, a first set of symbols may be retrieved (Step S34). If the first set of symbols can be decoded based exclusively on the information of the first set of symbols (Yes, Step S35) then the data thereof may be decoded without waiting for the entire group of sets of symbols to be retrieved (Step S36) and then the next set of symbols may be retrieved and decoded in a similar manner. However, if the first set of symbols cannot be decoded exclusively based on the information of the first set of symbols (No, Step S35) then a group of symbol sets, including the first set of symbols, may be retrieved (Step S37). Then, the first set of symbols, and the other sets of symbols of the group of symbols may be decoded based on the information of the group of symbols after the entire group of symbols has been retrieved (Step S38). Thereafter, additional data may be retrieved and decoded in the same manner.

Figure 4:
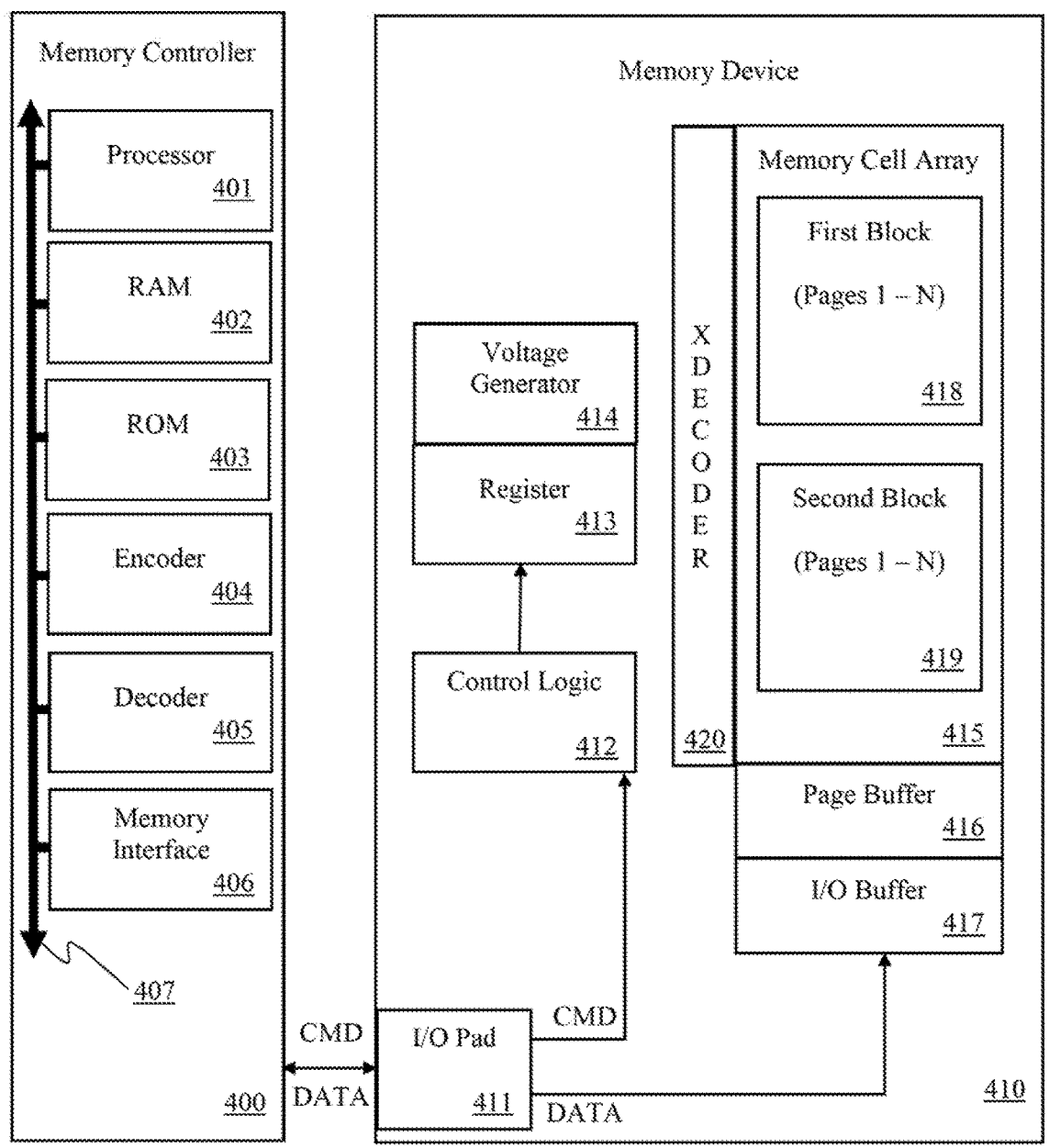
FIG. 4 is a block diagram of a memory system to which a memory according to some embodiments of the present inventive concept is applied.

As described above, exemplary embodiments of the present disclosure may encode data to be stored in a memory system and may then decode data retrieved from the memory system. FIG. 4 is a block diagram of a memory system to which a memory according to some embodiments of the present inventive concept is applied. Referring to FIG. 4, the memory system includes the memory controller 400 and a nonvolatile memory device 410.

The nonvolatile memory device 410 may be, but is not limited to, a flash memory device, a NAND flash memory device, a phase change RAM (PRAM), a ferroelectric RAM (FRAM), a magnetic RAM (MRAM), etc. According to at least one example embodiment of the inventive concepts, the nonvolatile memory device 410 may include a plurality of NAND flash memory devices. The nonvolatile memory device 410 may have a planar structure or a three-dimensional (3D) memory cell structure with a stack of memory cells.

The nonvolatile memory device 410 may include a memory cell array 415, an X decoder 420, a voltage generator 414, an I/O buffer 417, a page buffer 416, and a control logic 412 each of which may be implemented as one or more circuits. The nonvolatile memory device 410 may also include an input/output (I/O) pad 411.

The memory cell array 415 includes a plurality of word lines and a plurality of bit lines. Each memory cell of the memory cell array 415 may be implemented as a nonvolatile memory cell. For example, each memory cell of the memory cell array 415 may have, for example, a floating gate or a charge storage layer such as a charge trapping layer.

The memory cell array 415 may include a plurality of blocks and a plurality of pages. Each block includes a plurality of pages. For example, a first block 418 may include a first plurality of pages 1-N while a second block 419 may include a second plurality of pages 1-N, where N is an integer greater than 1. A page may be a unit of program and read operations, and a block may be a unit of erase operation.

The control logic 412 controls the overall operation of the nonvolatile memory device 410. When receiving a command CMD from the memory controller 400, the control logic 412 interprets the command CMD and controls the nonvolatile memory device 410 to perform an operation (e.g., a program operation, a read operation, a read retry operation, or an erase operation) according to the interpreted command CMD.

The X decoder 420 is controlled by the control logic 412 and drives at least one of the word lines in the memory cell array 415 according to a row address.

The voltage generator 414 is controlled by the control logic 412 to generate one or more voltages required for a program operation, a read operation or an erase operation and provide the generated voltages to one or more rows selected by the X decoder 420.

The page buffer 416 is controlled by the control logic 412 and operates as a sense amplifier or a write driver according to an operation mode (e.g., a read operation or a program operation).

The I/O pad 411 and the I/O buffer 417 may serve as I/O paths of data exchanged between an external device, e.g., the memory controller 400 or a host and the nonvolatile memory device 410.

The memory controller 400 may include a microprocessor 401, a read-only memory (ROM) 403, a random access memory (RAM) 402, an encoder 404, a decoder 405, a memory interface 406, and a bus 407. The elements 401 through 406 of the memory controller 400 may be electrically connected to each other through the bus 407.

The microprocessor 401 controls the overall operation of the memory system including the memory controller 400. The microprocessor 401 is a circuit that controls other elements by generating control signals. When power is supplied to the memory system, the microprocessor 401 drives firmware (e.g., stored in the ROM 403) for operating the memory system on the RAM 402, thereby controlling the overall operation of the memory system. According to at least one example embodiment of the inventive concepts, the microprocessor 401 may also issue instructions for controlling operations of other elements of the memory controller 400 including, for example, some or all of the ROM 403, RAM 402, encoder 404, decoder 405, memory interface 406, and a bus 407. According to at least one exemplary embodiment of the inventive concept, any operations described herein as being performed by the memory controller 400 may be performed by, or under the control of, the microprocessor 401. According to at least one exemplary embodiment of the inventive concept, any operations described herein as being performed by the memory controller 410 may be performed by, or under the control of, the microprocessor 401 executing instructions that correspond to the operations and are included in program code (e.g., stored in the ROM 403).

While a driving firmware code of the memory system is stored in the ROM 403, one or more example embodiments of the inventive concepts are not limited thereto. The firmware code can also be stored in a portion of the nonvolatile memory device 410. Therefore, the control or intervention of the microprocessor 401 may encompass not only the direct control of the microprocessor 401 but also the intervention of firmware which is software driven by the microprocessor 401.

The RAM 402, which is a memory serving as a buffer, may store an initial command, data, and various variables input from a host or the microprocessor 401, or data output from the nonvolatile memory device 410. The RAM 402 may store read data and various parameters and variables input to and output from the nonvolatile memory device 410.

The memory interface 116 may serve as an interface between the memory controller 1000 and the nonvolatile memory device 2000. The memory interface 116 is connected to the I/O pad 127 of the nonvolatile memory device 2000 and may exchange data with the I/O pad 127. In addition, the memory interface 116 may create a command suitable for the nonvolatile memory device 2000 and provide the created command to the I/O pad 127 of the nonvolatile memory device 2000. The memory interface 116 provides a command to be executed by the nonvolatile memory device 2000 and an address ADD of the nonvolatile memory device 2000.

According to at least one exemplary embodiment of the inventive concept, the decoder 405 may be an error correcting code (ECC) decoder configured to decode data in the manner described above, and the encoder 404 may be an ECC encoder configured to encode data in the manner described above. According to at least one exemplary embodiment of the inventive concept, the decoder 405 and the encoder 404 perform error bit correction in the manner described above. The encoder 404 may generate data added with one or more parity and/or redundancy bits by performing error correction encoding on data before the data is provided to the nonvolatile memory device 410. The one or more parity and/or redundancy bits may be stored in the nonvolatile memory device 410.

The decoder 405 may perform error correction decoding on output data, determine whether the error correction decoding is successful based on the result of the error correction decoding, and output an instruction signal based on the determination result. Read data may be transmitted to the decoder 405, and the decoder 405 may correct error bits of the data using the one or more parity and/or redundancy bits. When the number of error bits exceeds a limit of error bits that can be corrected, the decoder 405 may decode according to a higher level of data organization, as described in detail above. In an exemplary embodiment, the encoder 404 and the decoder 405 may perform error correction using a variation of Bose-Chaudhuri-Hocquenghem (BCH) that has been adapted to operate as described in detail above.

Exemplary embodiments of the present invention may be applied to a variation of BCH known as Super Bose- Chaudhuri-Hocquenghem (SBCH). SBCH is a multilevel algebraic code comprised of several short binary Bose-Chaudhuri-Hocquenghem (BCH) codes and non-binary Reed-Solomon (RS) codes. As opposed to the message-passing decoding algorithm of low density parity check (LDPC) codes, which requires iteratively interchanging large amounts of soft information between variable and check nodes, the decoding algorithm for SBCH codes is entirely algebraic, using standard algebraic decoding modes for the short component BCH and RS codes. For this reason, the power consumption of an SBCH decoder is considerably smaller than that of the corresponding LDPC decoder.

According to SBCH schemes:

$C_L \subset C_{L-1} \subset \ldots \subset C_0$—binary codes of length n $RS_1 \subset RS_2 \subset \ldots \subset RS_L$—Reed-Solomon (RS) codes of length $n_{rows}$ The SBCH code associated with the above codes:

all binary matrices $(c_{ij})_{i=1,\ldots,n_{rows}; j=1,\ldots,n}$ such that:

For all i, $c_i := (c_{ij}) \in C_0$

For all j=1, ..., L: $(\Delta syn_{j-1}{}^j(c_1), \ldots, \Delta syn_{j-1}{}^j(c_{n_{rows}})) \in RS_j$ (here $\Delta syn_{j-1}{}^j(\bullet)$ are the so-called "delta syndromes")

According to exemplary embodiments of the present disclosure, the RS codes "glue" the rows of a codeword. To use the RS codes properly in the decoding process, the entire received word is accessed. However, as discussed above, exemplary embodiments of the present invention may enable partial decoding. Here, frame error rate (FER) decreases as increasingly large chunks of the received word are accessed.

According to exemplary embodiments of the present disclosure, partial decoding may be enabled with locality. For example if a block length is 4 KBytes, the following may be enabled:

Decoding of each 1 KByte ("¼ block") with FER≈$10^{-3}$

Decoding of the full 4 KByte block with the usual FER≈$1^{-11}$

In case decoding of a ¼ block fails: read all block (4 KByte)

In this way, latency may be substantially decreased with a high probability. This may be implemented, as described above, by "gluing" together the rows of an SBCH word by the external RS code. To allow locality, the RS codes may be replaced by codes with locality. Locality may enable each group of rows to be "glued locally." Thus, the various words in a group of rows can "help each other" without using rows not in the group, using the locality property of the local codes replacing the RS codes. However, distinct groups of rows are still connected by the global dependencies of the local codes. Thus, in the case where a local group fails, successful decoding can be performed by accessing all rows.

The exemplary embodiments of the present invention described in detail above may be seen as falling into several possible embodiments. Embodiments A1 and A2 are provided herein as examples. These two approaches exemplify two optional algorithms that may be used to implement the present invention.

According to the A1 approach, here let q be a power of prime and $\alpha_1, \alpha_2, \ldots, \alpha_n$ be distinct nonzero elements of F=GF(q), and let $v_1, v_2, \ldots, v_n$ be nonzero elements of K (which do not have to be distinct). A generalized Reed-Solomon (in short, GRS) code over F is a linear [n, k, d] code C over F with a parity-check matrix $$H_{grs} = H \cdot V$$

where $V = \text{diag}(v_1, \ldots, v_n)$ and H is defined as in RS above:

$$H = \begin{matrix} 1 & 1 & \ldots & 1 \\ \alpha_1 & \alpha_2 & \ldots & \alpha_n \\ \alpha_1^2 & \alpha_2^2 & \ldots & \alpha_n^2 \\ \vdots & & & \\ \vdots & & & \\ \alpha_1^{n-k-1} & \alpha_2^{n-k-1} & \ldots & \alpha_n^{n-k-1} \end{matrix}$$

The resulting code is MDS, with minimal distance d=n−k+1. Take integer r and put $v_j = \alpha_j^r$ the resulting GRS code is denoted by $GRS_{n,k,r}$. It has the following check matrix $$H_{n-k,r}[\alpha_1, \alpha_2, \ldots, \alpha_n] \equiv \begin{matrix} \alpha_1^r & \alpha_2^r & \ldots & \alpha_n^r \\ \alpha_1^{r+1} & \alpha_2^{r+1} & \ldots & \alpha_n^{r+1} \\ \vdots & & & \\ \vdots & & & \\ \alpha_1^{n-k+r-1} & \alpha_2^{n-k+r-1} & \ldots & \alpha_n^{n-k+r-1} \end{matrix} \blacklozenge$$

Code definition. Next, a linear code C* is defined by determining positive integer parameters q, s≥1, $n_1, \ldots, n_s$, b, c, such that $N \equiv n_1 + \ldots + n_s < q$ and by and $\alpha_1, \alpha_2, \ldots, \alpha_N$ distinct nonzero elements of F. Put $N_0 = 0$ and for $1 \leq i \leq s$ set: $N_i = n_1 + \ldots + n_i$. Note that $N_s = N$. The elements of C* are in $F^N$. Define for $1 \leq i \leq s$:

$$H_i = H_{b,0}[\alpha_{N(i-1)+1}, \alpha_{N(i-1)+2}, \ldots, \alpha_{N(i)}]$$

$$H^{(1)} = H_{b,0}[\alpha_1, \alpha_2, \ldots, \alpha_N] = [H_1, H_2, \ldots, H_s]$$

and define:

$$H^{(2)} = H_{c,b}[\alpha_1, \alpha_2, \ldots, \alpha_N],$$

$$H^* = H_{b+c,0}[\alpha_1, \alpha_2, \ldots, \alpha_N] = \begin{bmatrix} H^{(1)} \\ H^{(2)} \end{bmatrix}.$$

Note H* is the check matrix of RS on $F^N$ that can correct a+b errors.

Next, for $x = [x_1, \ldots, x_N]^T \in F^N$ define:

$$x^{[i]} = [x_{N(i-1)+1}, x_{N(i-1)+2}, \ldots, x_{N(i)}]$$

Here, C* is defined as follows, for $x = [x_1, \ldots, x_N]^T \in F^N$ it holds that $x \in C^*$ iff for $1 \leq i \leq s$ $$H_i x^{[i]} = 0 \text{ and } H^{(2)} \cdot x.$$

Note that for $v = [v_1, \ldots, v_N]^T \in F^N$ it holds that:

$$H^{(1)} \cdot v = [H_1, H_2, \ldots, H_s] \cdot v = H_1 \cdot v^{[1]} + H_2 \cdot v^{[2]} + \ldots + H_s \cdot v^{[s]}$$

It follows if $x \in C^*$ then $H^{(1)} \cdot x = 0$ and $H^{(2)} \cdot x = 0$ and hence $H^* \cdot x = 0 \blacklozenge$ Decoding. Let $x = [x_1, \ldots, x_N]^T \in C^*$ be the transmitted word and $y = [y_1, \ldots, y_N]^T \in F^N$ be the received word. The decoder starts by applying the standard RS decoding method to each sub-interval $y^{[i]}$. It can correct any combination of i errors and j erasures such that 2i+j≤b at each sub interval $y^{[i]}$. When this is done some of the sub intervals will be cleared of all errors. Call the resulting word $z=[z_1, \ldots, z_N]^T \in F^N$. Since $H^* \cdot x=0$, it holds that RS decoder can now be applied to z to correct any combination of i remaining errors and j remaining erasures such that $2i+j \leq b+c$. This is effective for example if all but one sub-word are decoded in the first round and in the one un-decoded word the number of errors does not exceed b+c.

As mentioned above, in the A2 embodiment the grouping of $RS_t$ becomes $GCC^{RS}$ codeword. The following is a description of the $GCC^{RS}$ family of codes. In this family of codes, RS is used as both inner and outer code.

Here, $GCC^{RS}$ is a linear code C over F=GF(q), determined by the following parameters: q a power prime, positive integers T, J, m, and an integer sequence $J=R(1) \geq R(2) \geq \ldots \geq R(T)=0$, and T checks matrices $H_1, \ldots, H_T \in F^{m \times N}$. C evolves from internal codes $C_J \subseteq C_{J-1} \subseteq \ldots \subseteq C_1$ wherein $$C_t = \{x \in F^N : H_j \cdot x = 0 \text{ for } 1 \leq j \leq t\}, t \in [T]$$

Alternatively the condition of being in $C_t$ is stated such that the first t syndromes of x w.r.t. $(H_1, \ldots, H_T)$ are zero. Often in practice $C_t$ is BCH that can correct t errors or RS that can correct t/2 errors. A codeword $c \in C$ is given by $c=[c_1^T, \ldots, c_J^T]^T$, where $c_j \in C_1$ and $w_t=[c_1 \cdot H_t, \ldots, c_J \cdot H_t]$ is in $RS(q^m, J, J-R(t))$. That is, $w_t$ an RS word over the extension field $K=GF(q^m)$, of length J and of dimension J-R(t). This RS code can corrects any combination of i errors and j erasures such that $2i+j \leq R(t)$. Noting that $w_t$ has R(t) K-symbols of redundancy, which typically requires $m \cdot R(t)$ symbols of redundancy of the code C. Thus the overall redundancy is $m \cdot \Sigma_{1 \leq t \leq T} R(t)$ symbols of F.

Thus, exemplary embodiments of the present invention group together a few $GCC^{RS}$ words $C'_1, \ldots, C'_L$ such that each of them can be decoded in high probability in a standalone manner. However by adding some additional redundancy to the entire group, a larger codeword, comprising $C'_1, \ldots, C'_L$, is formed, with higher probability of decoding success. The added redundancy can replace some information symbols of the said component codewords.

The present decoding scheme starts with a separate decoding of each individual GCC codeword, $C'_i$. In case some of the GCC words in the group cannot be decoded, for t=1:T the standard RS decoder is applied to the above mentioned t RS-codeword of each $C'_i$, called here $w_{t,i}$ (see $w_t$ above). In case the decoding fails for any $w_{t,i}$ (for $i \in [L]$) a decoding scheme which is aided by the local RS is used. For example either of the above two approaches may be used, as outlined above, in an attempt to complete the decoding of the group of RS words $\{w_{t,i}\}_{1 \leq i \leq L}$.

In another embodiment, if some of the component GCC words failed decoding in the first round then the decoded words contribute with the help of the added redundancy prescribed by the invention to a second round of decoding separately each component codeword from the group $C'_1, \ldots, C'_L$ that was not decoded in the first round.

The present invention is based upon error correcting codes (ECC). In the technology of ECC, there is an underlining finite integer $r=2, 3 \ldots$ and finite algebraic field F, such that each symbol of F comprises r bits. An [n k] linear code C is associated with a k'n parity check matrix whose entries are in F. Here n and k are positive integers, (n larger than k) that are parameters of the code C, n is the code length in symbols and k is the code dimension. A codeword in C is a vector of n symbols from F whose product with the associated parity check matrix is zero.

For simplicity sake a word would mean here any vector of n symbols from F. A syndrome of a given word means a scalar product of said word by a row of the parity check matrix. The first syndrome of a given word is a scalar product of the word by the first row of the parity check matrix. The second syndrome of a given word is scalar product of the word by the second row etc. When the decoder knows more syndromes he can correct more errors.

The essential idea of GCC codes is that a few small codewords (e.g. of BCH code) that share the same parity check matrix are grouped together, where each is also called a sub-word. They are grouped in such manner that when the first syndrome from each sub-word is collected, a codeword is formed in RS. This codeword may be called $RS_1$. The same holds when the second syndrome is collected from each of these words—this collection is called $RS_2$, etc. In practice $RS_t$ is usually the zero word and the code rate of these RS words is increasing.

(i) The GCC encoding process is enabled by the fact that every syndrome of every small word can be made to equal an arbitrary prescribed symbol, by investing r bits of redundancy for it.

(ii) As described herein, the GCC idea is advanced a step forward. A few GCC words are grouped together and use (i) to form additional structure: For $t=1, 2, 3 \ldots$ cascading the $RS_t$ words from each of the GCC codewords yields a larger codeword. This method has the advantage that in the unlikely event of un-decodable individual GCC word, its collaboration with the other GCC words in the group enables—in most cases—a successful second round of decoding.

Example for (ii). In the following simplified example there are 2 GCC words, each comprising 3 small sub-codewords and three layers of syndromes.

(1) Syndromes associated with GCC_word_1:

$$\begin{pmatrix} \text{syndrome}(1,1,1) & \text{syndrome}(1,1,2) & \text{syndrome}(1,1,3) \\ \text{syndrome}(1,2,1) & \text{syndrome}(1,2,2) & \text{syndrome}(1,2,3) \\ \text{syndrome}(1,3,1) & \text{syndrome}(1,3,2) & \text{syndrome}(1,3,3) \end{pmatrix}$$

(2) Syndromes associated with GCC_word_2:

$$\begin{pmatrix} \text{syndrome}(2,1,1) & \text{syndrome}(2,1,2) & \text{syndrome}(2,1,3) \\ \text{syndrome}(2,2,1) & \text{syndrome}(2,2,2) & \text{syndrome}(2,2,3) \\ \text{syndrome}(2,3,1) & \text{syndrome}(2,3,2) & \text{syndrome}(2,3,3) \end{pmatrix}$$

In this example:

syndrome(1,1,1)=syndrome(1,1,2)=syndrome(1,1,3)=0 syndrome(2,1,1)=syndrome(2,1,2)=syndrome(2,1,2)=$0_{ind:}$

[syndrome(1,2,1), syndrome(1,2,2), syndrome(1,2,3)] is an RS word ($RS_2$)

[syndrome(2,2,1), syndrome(2,2,2), syndrome(2,2,3)] is an RS word ($RS_2$)

and in addition when these 2 RS words are cascaded, the result may be:

[syndrome(1,2,1), syndrome(1,2,2), syndrome(1,2,3), syndrome(2,2,1), syndrome(2,2,2), syndrome(2,2,3)

which is also code word. Likewise,

[syndrome(1,3,1), syndrome(1,3,2), syndrome(1,3,3)] is an RS word($RS_3$)

[syndrome(2,3,1), syndrome(2,3,2), syndrome(2,3,2)] is an RS word ($RS_3$)

and when these 2 RS words are cascaded, the result may be: [syndrome(1,3,1), syndrome(1,3,2), syndrome(1,3,3), syndrome(2,3,1), syndrome(2,3, which is also a codeword.

Note that commonly in technological implementations each GCC word comprises larger number of sub-codewords and syndromes. Thus with respect to all parameters this simplistic example is only for illustration.

Part (ii) encapsulates the main claim of the invention. Two embodiments, A1 & A2, are described below.

(iii) In A1 the above grouping of $RS_t$ becomes larger RS word, and in A2 the grouping of RS becomes $GCC^{RS}$ codeword, a notion which is described herein.

Figure 5:
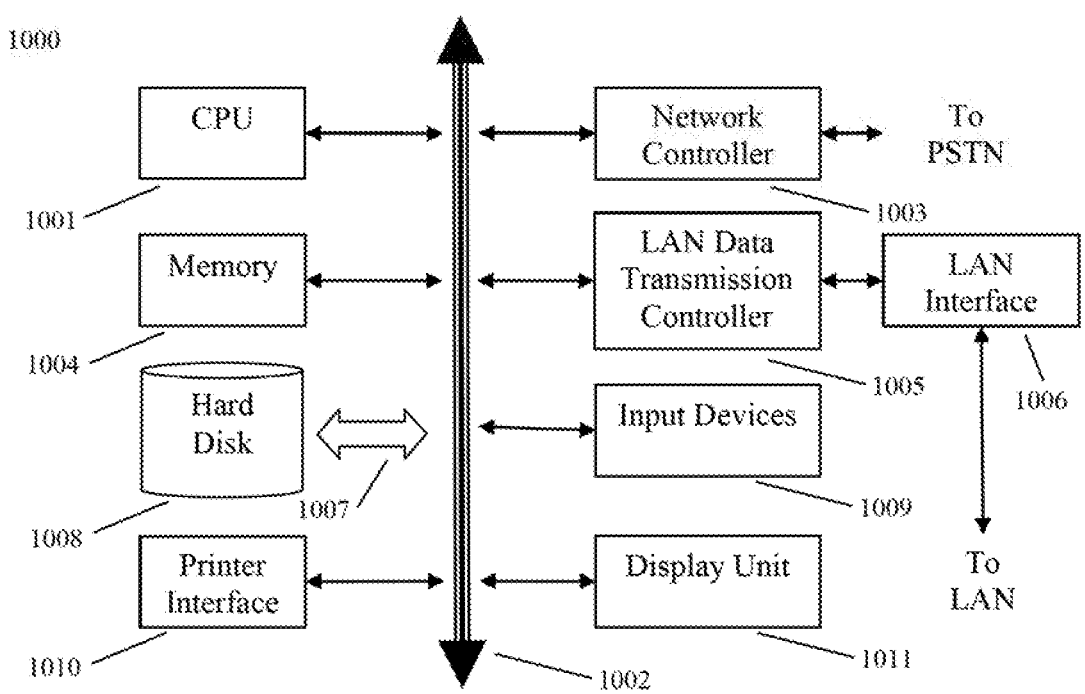
FIG. 5 shows an example of a computer system capable of implementing the method and apparatus according to embodiments of the present disclosure.

FIG. 5 shows an example of a computer system which may implement a method and system of the present disclosure. The system and method of the present disclosure may be implemented in the form of a software application running on a computer system, for example, a mainframe, personal computer (PC), handheld computer, server, etc. The software application may be stored on a recording media locally accessible by the computer system and accessible via a hard wired or wireless connection to a network, for example, a local area network, or the Internet.

The computer system referred to generally as system 1000 may include, for example, a central processing unit (CPU) 1001, random access memory (RAM) 1004, a printer interface 1010, a display unit 1011, a local area network (LAN) data transmission controller 1005, a LAN interface 1006, a network controller 1003, an internal bus 1002, and one or more input devices 1009, for example, a keyboard, mouse etc. As shown, the system 1000 may be connected to a data storage device, for example, a hard disk, 1008 via a link 1007.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. A method for storing data within a memory device, comprising:
   receiving data to be stored;
   encoding the received data; and
   storing the encoded data within the memory device,
   wherein encoding the received data comprises encoding the data into two or more sub-codewords that are each independently decodable to reconstruct the received data with a first level of error correction,
   wherein each of the two or more sub-codewords comprises a plurality of outer codewords, and
   wherein two or more of the plurality of outer codewords are grouped to form a larger codeword that is larger than each of the plurality of outer codewords and the larger codeword is independently decodable to reconstruct the received data with a second level of error correction that is more robust than the first level of error correction.

2. The method of claim 1, wherein the larger codeword includes more redundancy of the data than do the plurality of outer codewords, individually.

3. The method of claim 1, wherein the larger codeword that includes the two or more of the plurality of outer codewords is a generalized concatenated code (GCC) codeword.

4. The method of claim 1, wherein each of the two or more sub-codewords is a generalized concatenated code (GCC) codeword and each of the plurality of outer codewords and the larger codeword is a Reed-Solomon codeword.

5. The method of claim 1, wherein each of the two or more sub-codewords represents a first layer of encoding, each of the plurality of outer codewords represents a second layer of encoding, and the larger codeword represents a third layer of encoding.

6. The method of claim 1, wherein the larger codeword is independently decodable using a matrix comprised by a first several rows of a parity-check matrix of the larger codeword that is formed by cascading parity check matrices of each of the plurality of codewords.

7. The method of claim 1, wherein each of the two or more sub-codewords comprises multiple layers of outer codewords of the plurality of outer codewords and at each of the multiple layers, grouping together corresponding outer codewords of the plurality of outer codewords constitutes a generalized concatenated code (GCC) codeword.

8. A method for retrieving data within a memory device, comprising:
   reading stored data from a memory device; and
   decoding the read data,
   wherein decoding the read data comprises individually decoding sub-codewords of the read data to reconstruct original data, and
   wherein when a sub-codeword of the read data cannot be decoded, decoding the read data comprises decoding a plurality of outer codewords, each of which includes two car more sub-codewords including the sub-codeword that could not be individually encoded to reconstruct the original data, without individually decoding the sub-codewords of the read data.

9. The method of claim 8, wherein the plurality of outer codewords constitutes a larger codeword that is larger than each of the plurality of outer codewords.

10. The method of claim 9, wherein the larger codeword includes more redundancy of the stored data than do the plurality of outer codewords, individually.

11. The method of claim 9, wherein the larger codeword that includes the plurality of outer codewords is a generalized concatenated code (GCC) codeword.

12. The method of claim 9, wherein each of the two or more sub-codewords is a generalized concatenated code (GCC) codeword and each of the plurality of outer codewords and the larger codeword is a Reed-Solomon on codeword.

13. The method of claim 9, wherein each of the two or more sub-codewords represents a first layer of encoding, each of the plurality of outer codewords represents a second layer of encoding, and the larger codeword represents a third layer of encoding.

14. The method of claim 9, wherein when the sub-codeword of the read data cannot be decoded, decoding the read data includes using a matrix comprised by a first several rows of a parity-check matrix of the larger codeword that is formed by cascading parity check matrices of each of the plurality of codewords.

15. The method of claim 9, wherein each of the two or more sub-codewords comprises multiple layers of outer codewords of the plurality of outer codewords and at each of the multiple layers, grouping together corresponding outer codewords of the plurality of outer codewords constitutes a generalized concatenated code (GCC) codeword.

16. A method for storing data within a memory device, comprising:

receiving data to be stored;

encoding the received data; and storing the encoded data within the memory device, wherein encoding the received data comprises:

encoding the data into a plurality of sub-codewords that are each independently decodable to reconstruct the received data with a first level of error correction within a first layer of encoding;

grouping the plurality of sub-codewords into a plurality of outer codewords independently decodable to reconstruct the received data with a second level of error correction that is more robust than the first level of error correction within a second layer of encoding; and grouping the plurality of outer codewords into at least one larger codeword that is larger than each of the plurality of outer codewords, the larger codeword being independently decodable to reconstruct the received data with a third level of error correction that is more robust than the second level of error correction.

17. The method of claim 16, wherein the at least one larger codeword includes more redundancy of the data than do the plurality of outer codewords, individually.

18. The method of claim 16, wherein the larger codeword is independently decodable using a matrix comprised by a first several rows of a parity-check matrix of the larger codeword that is formed by cascading parity check matrices of each of the plurality of codewords.

19. The method of claim 16, wherein each of the sub-codewords comprises multiple layers of the outer codewords and at each of the multiple layers, corresponding outer codewords are grouped together as a generalized concatenated code (GCC) codeword.

20. The method of claim 16, further comprising:

reading the stored data from the memory device; and decoding the read data, wherein decoding the read data comprises individually decoding the sub-codewords of the read data, wherein when one of the sub-codewords of the read data cannot be decoded, decoding the read data comprises decoding the plurality of outer codewords including the sub-codeword that could not be individually encoded.

* * * * *